United States Patent
Lee et al.

(10) Patent No.: US 11,864,464 B2
(45) Date of Patent: Jan. 2, 2024

(54) METHOD FOR POLARIZING PIEZOELECTRIC FILM

(71) Applicant: CREATING NANO TECHNOLOGIES, INC., Tainan (TW)

(72) Inventors: Ji-Yung Lee, Tainan (TW); Andrew Ronaldi Tandio, Tainan (TW); Bo-Fan Tsai, Tainan (TW)

(73) Assignee: CREATING NANO TECHNOLOGIES, INC., Tainan (TW)

( * ) Notice: Subject to any disclaimer, the term of this patent is extended or adjusted under 35 U.S.C. 154(b) by 230 days.

(21) Appl. No.: 17/163,585

(22) Filed: Feb. 1, 2021

(65) Prior Publication Data
US 2021/0320242 A1  Oct. 14, 2021

(30) Foreign Application Priority Data
Apr. 10, 2020 (TW) ................................. 109112233

(51) Int. Cl.
*H10N 30/045* (2023.01)
*H10N 30/077* (2023.01)
*H10N 30/857* (2023.01)

(52) U.S. Cl.
CPC ......... *H10N 30/045* (2023.02); *H10N 30/077* (2023.02); *H10N 30/857* (2023.02)

(58) Field of Classification Search
CPC .... H01L 41/257; H01L 41/193; H01L 41/317
See application file for complete search history.

(56) References Cited

U.S. PATENT DOCUMENTS 5,153,859 A * 10/1992 Chatigny .................. B32B 7/12
                                                                    29/25.35
11,363,707 B2 * 6/2022 Lee ........................ H05H 1/2406
(Continued)

FOREIGN PATENT DOCUMENTS

| CN | 107924986 A | 4/2018 |
| CN | 109494298 A * | 3/2019 |

(Continued)

OTHER PUBLICATIONS

Williams et. al., "Atmospheric Pressure Plasma Activation of Polymers and Composites for Adhesive Bonding: A Critical Review", Rev. Adhesion Adhesives, vol. 1, No. 1, Feb. 2013, pp. 46-87 (Year: 2013).*

*Primary Examiner* — Peter Dungba Vo
*Assistant Examiner* — Jose K Abraham
(74) *Attorney, Agent, or Firm* — CKC & Partners Co., LLC

(57) ABSTRACT

A method for polarizing a piezoelectric film is described. In this method, a piezoelectric film is formed by using an injection deposition method. The piezoelectric film is flat adhered to a surface of a conductive substrate. A polarization process is performed on the piezoelectric film while the piezoelectric film is flat adhered to the surface of the conductive substrate by generating static electricity on the adhesion surface of the piezoelectric film, and generating the static electricity on the adhesion surface of the piezoelectric film comprises using a pressurized gas to blow the adhesion surface, and the adhesion surface of the piezoelectric film is adhered to the even surface of the conductive substrate by an electrostatic adsorption method.

12 Claims, 4 Drawing Sheets

(56) References Cited

U.S. PATENT DOCUMENTS

| | | | | |
|---|---|---|---|---|
| 2008/0034873 A1* | 2/2008 | Habu | ............... | H01L 41/43 |
| | | | | 310/361 |
| 2010/0112233 A1* | 5/2010 | Iwamoto | ............ | C23C 14/58 |
| | | | | 427/523 |
| 2013/0121514 A1* | 5/2013 | Lee | .............. | H04R 31/00 |
| | | | | 381/190 |
| 2013/0153813 A1* | 6/2013 | Honda | ............ | C30B 33/12 |
| | | | | 252/62.9 R |
| 2013/0256581 A1* | 10/2013 | Miyoshi | .......... | H01L 41/0805 |
| | | | | 427/535 |
| 2014/0191618 A1* | 7/2014 | Kijima | ........... | H10N 30/045 |
| | | | | 29/25.35 |
| 2014/0319405 A1* | 10/2014 | Kijima | ........... | G02F 1/3558 |
| | | | | 29/25.35 |
| 2016/0005951 A1* | 1/2016 | Yoshida | .......... | H10N 30/057 |
| | | | | 310/354 |
| 2016/0264742 A1* | 9/2016 | Kou | .............. | H01L 41/193 |
| 2017/0125662 A1* | 5/2017 | Iwamoto | ........ | C23C 14/48 |
| 2017/0317268 A1* | 11/2017 | Sato | ............. | H10N 30/1051 |
| 2018/0160248 A1* | 6/2018 | Murakami | ..... | H04R 31/003 |
| 2019/0189889 A1* | 6/2019 | Benedict | ....... | H01L 41/083 |
| 2019/0363241 A1* | 11/2019 | Huang | ........... | H01L 41/1132 |

FOREIGN PATENT DOCUMENTS

| | | | | | |
|---|---|---|---|---|---|
| JP | 2011181748 | A | * | 9/2011 | |
| JP | 6638395 | B2 | * | 1/2020 | ............ C08J 5/18 |
| KR | 20070013167 | A | * | 1/2007 | |
| TW | I400964 | B | | 7/2013 | |

* cited by examiner

METHOD FOR POLARIZING PIEZOELECTRIC FILM

RELATED APPLICATIONS

This application claims priority to Taiwan Application Serial Number 109112233, filed Apr. 10, 2020, which is herein incorporated by reference.

BACKGROUND

Field of Invention

The present disclosure relates to a technique for manufacturing a piezoelectric film, and more particularly, to a method for polarizing a piezoelectric film.

Description of Related Art

Polarity directions of electrical domains in a piezoelectric material are often irregular and are counteracted with each other to make the entire piezoelectric material have no polarity easily, such that the piezoelectric property of the material cannot be presented. Thus, the piezoelectric material usually needs to undergo a polarization process to coincide the directions the electrical domains in the piezoelectric material to present the piezoelectric property.

A non-contact polarization technique performs a polarization process by applying a high electric field to regularly arrange the molecules in the piezoelectric film along the electric field, so as to make the piezoelectric film present the piezoelectric property. The corona discharge is easily generated, and can provide a high electric field environment required by the polarization process, such that a corona discharge technique is now used to provide electrons. In some polarization apparatuses using the corona discharge technique, the electrons firstly pass through a high negative voltage grid and then arrive at a surface to be polarized.

An organic piezoelectric film is typically made of a piezoelectric material solution or liquid by various film-forming methods. For example, some of the film-forming methods form films by a coating method with using of substrates; and some other of the film-forming methods form films by an injection deposition method without using a substrate. When the piezoelectric film is formed on the substrate, a stripping procedure usually has to be performed on the piezoelectric film to separate the piezoelectric film from the substrate after the film is formed, so as to benefit the proceeding of subsequent processes. After various treatments without being carried by the substrate, the piezoelectric film has to undergo a polarization process. In the polarization process, a high electric field of a polarization apparatus forces directions of electrical domains in the piezoelectric film to change, so as to make the piezoelectric film present the piezoelectric property. However, forcing the directions of the electrical domains in the piezoelectric film to change increases an internal stress of the piezoelectric film. Furthermore, in the polarization process, a large number of charges accumulate on a surface of the piezoelectric film to cause deformation of the film, which has had the piezoelectric property. Under the double inference of the internal stress and the deformation, the surface of the piezoelectric film presents compression, expansion, wrinkle, or other phenomenon that damages the appearance of the piezoelectric film, and thus causing problems on subsequent processes and applications of the piezoelectric film.

SUMMARY

Therefore, one objective of the present invention is to provide a method for polarizing a piezoelectric film, which adheres the piezoelectric film to a surface of a conductive substrate before a polarization process of the piezoelectric film is performed. Thus, the piezoelectric film can be provided with a plane supporting force by the conductive substrate during the polarization process of the piezoelectric film, such that the piezoelectric film can resist an internal stress and deformation generated in the polarization process. Accordingly, it can ensure that the piezoelectric film still keeps flat after the polarization process.

Another objective of the present invention is to provide a method for polarizing a piezoelectric film, which can achieve polarization of the piezoelectric film while keeping the piezoelectric film flat, such that it benefits subsequent processes and applications of the polarized piezoelectric film.

According to the aforementioned objectives, the present invention provides a method for polarizing a piezoelectric film. In this method, a piezoelectric film is formed by using an injection deposition method. The piezoelectric film is flat adhered to a surface of a conductive substrate. A polarization process is performed on the piezoelectric film while the piezoelectric film is flat adhered to the surface of the conductive substrate.

According to one embodiment of the present invention, the piezoelectric film includes a PVDF homopolymer.

According to one embodiment of the present invention, the conductive substrate is a metal plate, a metal film, a carbon plate, or a metal coil.

According to one embodiment of the present invention, the conductive substrate includes a base and a conductive layer. The base includes a plastic film, a transparent glass, or a plastic plate. The conductive layer is disposed on the base, in which a surface of the conductive layer is the surface of the conductive substrate. The conductive layer includes a metal layer, a conductive oxide layer, or a carbon nanopowder paste layer.

According to one embodiment of the present invention, flat adhering the piezoelectric film to the surface of the conductive substrate includes applying a pressing force on the piezoelectric film and the conductive substrate, generating static electricity on an adhesion surface of the piezoelectric film, or using a conductive adhesive to bond the piezoelectric film and the surface of the conductive substrate.

According to one embodiment of the present invention, generating static electricity on the adhesion surface of the piezoelectric film includes performing a plasma treatment on the adhesion surface or using a high pressure gas to blow the adhesion surface.

According to the aforementioned objectives, the present invention further provides a method for polarizing a piezoelectric film. In this method, a piezoelectric film is formed on a substrate by using a coating method. A stripping treatment is performed to detach the piezoelectric film from the substrate. The piezoelectric film is flat adhered to a surface of a conductive substrate. A polarization process is performed on the piezoelectric film while the piezoelectric film is flat adhered to the surface of the conductive substrate.

According to one embodiment of the present invention, the piezoelectric film comprises a PVDF copolymer.

According to one embodiment of the present invention, the conductive substrate is a metal plate, a metal film, a carbon plate, or a metal coil.

According to one embodiment of the present invention, the conductive substrate includes a base and a conductive layer. The base includes a plastic film, a transparent glass, or a plastic plate. The conductive layer is disposed on the base, in which a surface of the conductive layer is the surface of the conductive substrate. The conductive layer includes a metal layer, a conductive oxide layer, or a carbon nanopowder paste layer.

According to one embodiment of the present invention, flat adhering the piezoelectric film to the surface of the conductive substrate comprises applying a pressing force on the piezoelectric film and the conductive substrate, generating static electricity on an adhesion surface of the piezoelectric film, or using a conductive adhesive to bond the piezoelectric film and the surface of the conductive substrate.

According to one embodiment of the present invention, generating static electricity on the adhesion surface of the piezoelectric film includes performing a plasma treatment on the adhesion surface or using a high pressure gas to blow the adhesion surface.

According to the aforementioned objectives, the present invention further provides a method for polarizing a piezoelectric film. In this method, a piezoelectric film is formed on a surface of a conductive substrate. The forming of the piezoelectric film on the surface of the conductive substrate includes flat adhering the piezoelectric film on the surface of the conductive substrate. A polarization process is performed on the piezoelectric film while the piezoelectric film is flat adhered to the surface of the conductive substrate.

According to one embodiment of the present invention, the piezoelectric film includes a PVDF homopolymer or a PVDF copolymer.

According to one embodiment of the present invention, the conductive substrate is a metal plate, a metal film, a carbon plate, or a metal coil.

According to one embodiment of the present invention, the conductive substrate includes a base and a conductive layer. The base includes a plastic film, a transparent glass, or a plastic plate. The conductive layer is disposed on the base, in which a surface of the conductive layer is the surface of the conductive substrate. The conductive layer includes a metal layer, a conductive oxide layer, or a carbon nanopowder paste layer.

BRIEF DESCRIPTION OF THE DRAWINGS

The aforementioned and other objectives, features, advantages and examples of invention can be more fully understood by reading the following detailed description of the embodiment, with reference made to the accompanying drawings as follows.

DETAILED DESCRIPTION

Figure 1A:
FIG. 1A to FIG. 1C are schematic diagrams of various stages showing a method for polarizing a piezoelectric film in accordance with a first embodiment of the present invention.
Figure 1B:
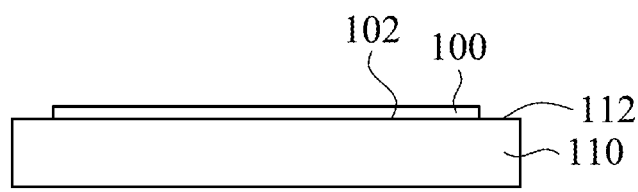
Figure 1C:
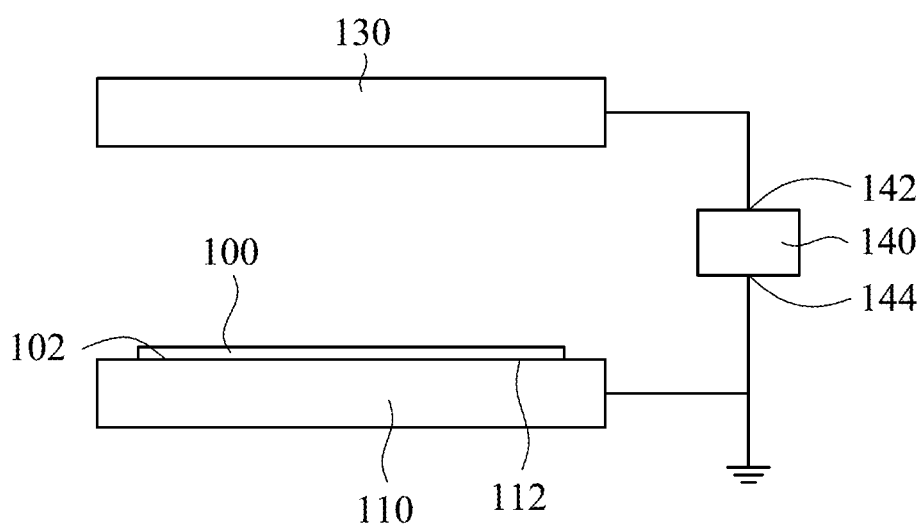

Various embodiments of the present invention can be applied in polarization of organic piezoelectric films or inorganic piezoelectric films, especially the organic piezoelectric films. Referring to FIG. 1A to FIG. 1C, FIG. 1A to FIG. 1C are schematic diagrams of various stages showing a method for polarizing a piezoelectric film in accordance with a first embodiment of the present invention. In the present embodiment, in polarizing of a piezoelectric film 100, the piezoelectric film 100 may be firstly provided, as shown in FIG. 1A. The piezoelectric film 100 may be an organic piezoelectric film or an inorganic piezoelectric film. In some examples, the organic piezoelectric film 100 may be formed by using an injection deposition method. In such examples, it does not need a substrate while forming the piezoelectric film 100. In addition, the piezoelectric film 100 may include, but be not limited to, a PVDF homopolymer, for example. Most of the organic piezoelectric films 100, such as PVDF homopolymers, need a stretching treatment after the film is formed.

As shown in FIG. 1B, when the piezoelectric film 100 is provided, a conductive substrate 110 may be also provided, and the formed piezoelectric film 100 is adhered to a surface 112 of the conductive substrate 110. The surface 112 of the conductive substrate 110 is an even surface, such that the piezoelectric film 100 can be disposed on the surface 112 of the conductive substrate 110 by a flat adhesion method. It has to ensure that there is no air bubble between the piezoelectric film 100 and the surface 112 of the conductive substrate 110 while adhering, to prevent degrading of polarization uniformity and permanent deformation of the piezoelectric film 100 during the subsequent polarization, thereby preventing overall quality of the piezoelectric film 100 from being reduced.

In some examples, when the piezoelectric film 100 is adhered to the surface 112 of the conductive substrate 110, a pressing force may be applied to the piezoelectric film 100 and the conductive substrate 110, so as to use the pressing force to tightly bond an adhesion surface 102 of the piezoelectric film 100 and the surface 112 of the conductive substrate 110.

In some examples, when the piezoelectric film 100 is adhered to the surface 112 of the conductive substrate 110, static electricity may be firstly generated on the adhesion surface 102 of the piezoelectric film 100, and the adhesion surface 102 of the piezoelectric film 100 is tightly adhered to the surface 112 of the conductive substrate 110 by an electrostatic adsorption method. In such examples, the static electricity may be generated on the adhesion surface 102 of the piezoelectric film 100 by performing a plasma treatment on the adhesion surface 102 of the piezoelectric film 100, or using a high pressure gas to blow the adhesion surface 102 of the piezoelectric film 100.

In some examples, when the piezoelectric film 100 is adhered to the surface 112 of the conductive substrate 110, a conductive adhesive may be additionally used to bond the adhesion surface 102 of the piezoelectric film 100 and the surface 112 of the conductive substrate 110. In some exemplary examples, when the conductive adhesive is used to bond the adhesion surface 102 of the piezoelectric film 100 and the surface 112 of the conductive substrate 110, a conductive adhesive layer, a conductive pressure sensitive adhesive, or a heat pressing glue may be formed on the adhesion surface 102 of the piezoelectric film 100 and/or the surface 112 of the conductive substrate 110.

The conductive substrate 110 must have a structural strength which is sufficient to support the piezoelectric film 100, to prevent the piezoelectric film 100 from be deformed. In some examples, the conductive substrate 110 may be a metal plate, a metal film, a carbon plate, or a metal coil, in which the metal coil may be applied in a roll-to-roll (RTR) polarization process of the piezoelectric film 100. The conductive substrate 110 has to undergo the polarization process as the piezoelectric film 100 to be polarized. For example, for some roll-to-roll or in-line polarization apparatuses, the conductive substrate 110 needs to move as the piezoelectric film 100 for the polarization process.

Figure 2:
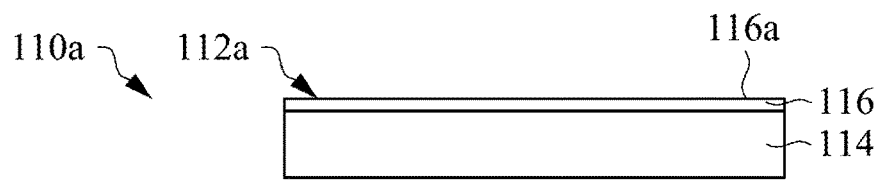
FIG. 2 is a schematic side view of a conductive substrate in accordance with an embodiment of the present invention.

Referring to FIG. 2 firstly, FIG. 2 is a schematic side view of a conductive substrate in accordance with an embodiment of the present invention. In some examples, the conductive substrate 110 may be replaced with a conductive substrate 110a. The conductive substrate 110a may mainly include a base 114 and a conductive layer 116, in which the conductive layer 116 is disposed on the base 114. The conductive layer 116 may be disposed on the base 114 by, for example, plating or coating. A surface 116a of the conductive layer 116 is a surface 112a of the conductive substrate 110a, i.e. a flat surface of the conductive substrate 110a to be bonded to the adhesion surface of the piezoelectric film. The base 114 may be a non-conductive material, such as a plastic film, a transparent glass, or a plastic plate. The conductive layer 116 may include a metal layer, a conductive oxide layer, or a carbon nanopowder paste layer. In some exemplary examples, the conductive substrate 110a may be a plastic film plated with a metal layer, a transparent glass plated with a conductive oxide layer, or a plastic plate coated or printed with a metal powder layer or a carbon nanopowder paste layer.

Referring to FIG. 1C continuously, after the adhering procedure of the piezoelectric film 110 and the surface 112 of the conductive substrate 110 is completed, a polarization process may be performed on the piezoelectric film 100 while the piezoelectric film 100 is flat adhered to the surface 112 of the conductive substrate 110, to regularly arrange molecules in the piezoelectric film 100 along an electric field, so as to make the piezoelectric film 100 present a piezoelectric property. In some examples, the polarization process of the piezoelectric film 100 may be performed by using plasma. For example, in the polarizing of the piezoelectric film 100, a plasma source 130 is disposed over the surface 112 of the conductive substrate 110 and the piezoelectric film 100, a first electrode 142 of a power supply 140 is electrically connected to the plasma source 130, a second electrode 144 of the power supply is grounded, and the conductive substrate 110 is also grounded. The first electrode 142 and the second electrode 144 of the power supply 140 have different electric potential. After the plasma source 130 is powered by the power supply 140, the plasma source 130 can generate plasma, and the plasma is jet toward the piezoelectric film 100 on the surface 112 of the conductive substrate 110 to polarize the piezoelectric film 100.

The piezoelectric film 100 is tightly flat adhered to the surface 112 of the conductive substrate 110 during the polarization process, such that the conductive substrate 110 can provide the piezoelectric film 100 with a plane supporting force during the polarization process. Accordingly, the piezoelectric film 100 can resist an internal stress and deformation generated in the polarization process, such that the piezoelectric film 100 still keeps flat after polarizing, thereby benefiting applications and subsequent processes.

Figure 3A:
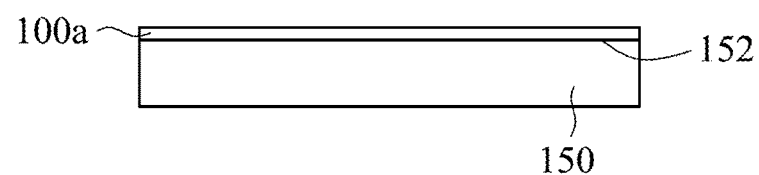
FIG. 3A to FIG. 3D are schematic diagrams of various stages showing a method for polarizing a piezoelectric film in accordance with a second embodiment of the present invention.

Referring to FIG. 3A to FIG. 3D, FIG. 3A to FIG. 3D are schematic diagrams of various stages showing a method for polarizing a piezoelectric film in accordance with a second embodiment of the present invention. When a polarization method of the present embodiment is performed, a piezoelectric film 100a may be firstly provided. In some examples, as shown in FIG. 3A, providing the piezoelectric film 100a may firstly form the piezoelectric film 100a by providing a substrate 150 and forming the piezoelectric film 100a on a surface 152 of the substrate 150 using a coating method, for example. Thus, in such examples, the substrate 150 is needed while the piezoelectric film 100a is formed. In addition, the piezoelectric film 100a may include, but be not limited to, a PVDF derivative copolymer, for example. When a material of the piezoelectric film 100a is the organic material, such as the PVDF derivative copolymer, a stretching treatment is not needed after the film is formed.

Figure 3B:
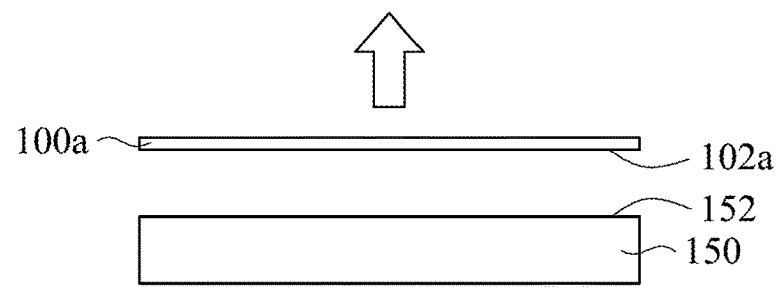

In some examples, as shown in FIG. 3B, in the providing of the piezoelectric film 100a, a stripping treatment may be performed on the piezoelectric film 100a to separate an adhesion surface 102a of the piezoelectric film 100a from the surface 152 of the substrate 150, so as to detach the piezoelectric film 100a from the substrate 150. After the piezoelectric film 100a is detached from the substrate 150, a stretching treatment may be performed on the piezoelectric film 100a. In some examples, the substrate 150 is made of a non-conductive material, such that although some piezoelectric materials do not need the stretching treatment after the films are formed, the stripping treatment of the piezoelectric film 100a is still needed due to the substrate 150 is a non-conductor to benefit the proceeding of the subsequent polarization process. That is when the piezoelectric film 100a needs a stretching treatment, or when the substrate 150, where the piezoelectric film 100a is formed, is a non-conductor, it has to perform a stripping treatment on the piezoelectric film 100a.

Figure 3C:
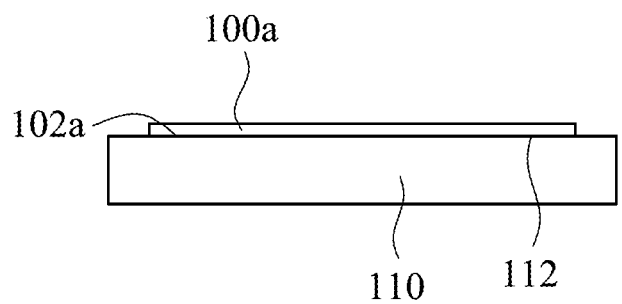

As shown in FIG. 3C, after the stripping treatment, when the piezoelectric film 100a is provided, a conductive substrate 110 may be also provided, and the piezoelectric film 100a detached from the substrate 150 may be adhered to a surface 112 of the conductive substrate 110. Similarly, the surface 112 of the conductive substrate 110 is an even surface, such that the piezoelectric film 100a can be disposed on the surface 112 of the conductive substrate 110 by a flat adhesion method. The examples of the technique for adhering the piezoelectric film 100a to the surface 112 of the conductive substrate 110 have been described in the aforementioned embodiment, and are not repeated herein. In addition, the conductive substrate 110 may also be replaced with the conductive substrate 110a in FIG. 2.

Figure 3D:
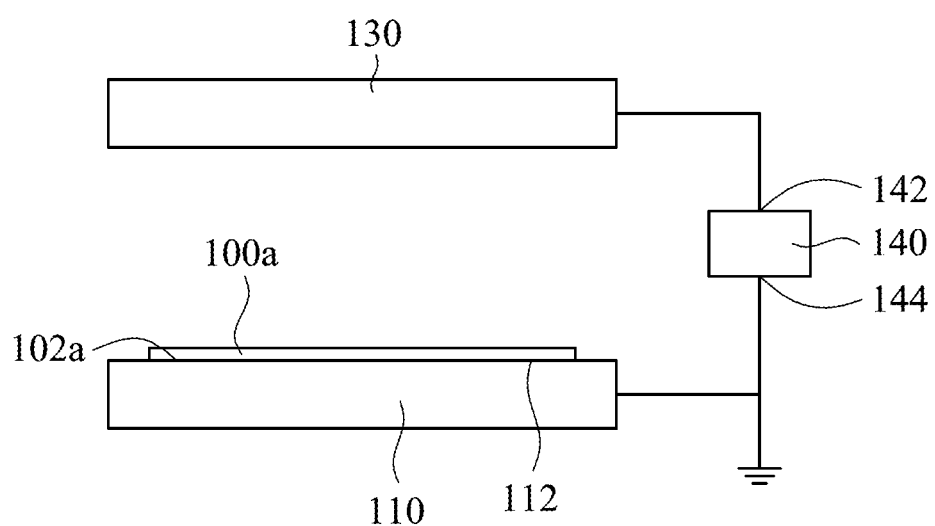

Then, as shown in FIG. 3D, a polarization process may be performed on the piezoelectric film 100a by using, for example, plasma while the piezoelectric film 100a is flat adhered to the surface 112 of the conductive substrate 110 to make the piezoelectric film 100a present a piezoelectric property. The examples of the apparatus configuration and the operation of the polarization process have been described in the aforementioned embodiment, and are not repeated herein.

Figure 4A:
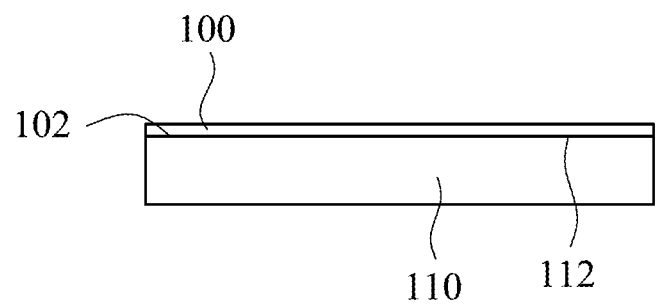
FIG. 4A and FIG. 4B are schematic diagrams of various stages showing a method for polarizing a piezoelectric film in accordance with a third embodiment of the present invention.
Figure 4B:
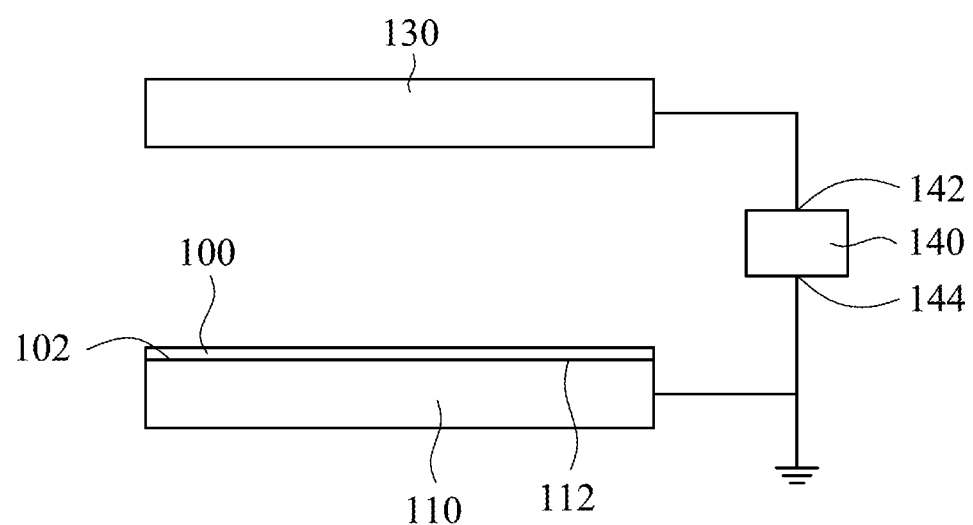

Referring to FIG. 4A and FIG. 4B, FIG. 4A and FIG. 4B are schematic diagrams of various stages showing a method for polarizing a piezoelectric film in accordance with a third embodiment of the present invention. When a polarization method of the present embodiment is performed, a piezoelectric film 100 may be firstly provided. In some examples, as shown in FIG. 4A, providing the piezoelectric film 100 may firstly form the piezoelectric film 100 by providing a conductive substrate 110 and forming the piezoelectric film 100 on a surface 112 of the conductive substrate 110 using a coating method, for example. In such examples, the piezoelectric film 100 is directly formed on the surface 112 of the conductive substrate 110. In the present embodiment, the conductive substrate 110 may also be replaced with the conductive substrate 110a in FIG. 2. The piezoelectric film 100 of the present embodiment may include, but be not limited to, a PVDF homopolymer or a PVDF derivative copolymer, for example.

The piezoelectric film 100 is directly formed on the surface 112 of the conductive substrate 110, such that a polarization process may be directly performed on the piezoelectric film 100 without performing a stripping treatment and an adhesion treatment for bonding to a conductive substrate used in the polarization process on the piezoelectric film 100. In some examples, if the material of the piezoelectric film 100 needs a stretching treatment after the film is formed, a stripping treatment and an adhesion treatment for bonding to a conductive substrate have to be performed on the piezoelectric film 100 as the example shown in FIG. 3B and FIG. 3C.

Then, as shown in FIG. 4B, a polarization process may be performed on the piezoelectric film 100 by using, for example, plasma while the piezoelectric film 100 is flat adhered to the surface 112 of the conductive substrate 110 to make the piezoelectric film 100 present a piezoelectric property. The examples of the apparatus configuration and the operation of the polarization process have been described in the aforementioned embodiment, and are not repeated herein.

According to the aforementioned embodiments, one advantage of the present invention is that a method for polarizing a piezoelectric film of the present invention adheres the piezoelectric film to a surface of a conductive substrate before a polarization process of the piezoelectric film is performed. Thus, the piezoelectric film can be provided with a plane supporting force by the conductive substrate during the polarization process of the piezoelectric film, such that the piezoelectric film can resist an internal stress and deformation generated in the polarization process. Accordingly, it can ensure that the piezoelectric film still keeps flat after the polarization process.

According to the aforementioned embodiments, another advantage of the present invention is that a method for polarizing a piezoelectric film of the present invention can achieve polarization of the piezoelectric film while keeping the piezoelectric film flat, such that it benefits subsequent processes and applications of the polarized piezoelectric film.

Although the present invention has been described in considerable detail with reference to certain embodiments thereof, the foregoing embodiments of the present invention are illustrative of the present invention rather than limiting of the present invention. It will be apparent to those having ordinary skill in the art that various modifications and variations can be made to the present invention without departing from the scope or spirit of the invention. Therefore, the spirit and scope of the appended claims should not be limited to the description of the embodiments contained herein.

What is claimed is:

1. A method for polarizing a piezoelectric film, comprising:
    forming a piezoelectric film by using an injection deposition method;
    flat adhering the piezoelectric film to an even surface of a conductive substrate to make an adhesion surface of the piezoelectric film being in contact with the even surface of the conductive substrate, wherein flat adhering the piezoelectric film to the even surface of the conductive substrate comprises generating static electricity on the adhesion surface of the piezoelectric film, and generating the static electricity on the adhesion surface of the piezoelectric film comprises using a pressurized gas to blow the adhesion surface, and the adhesion surface of the piezoelectric film is adhered to the even surface of the conductive substrate by an electrostatic adsorption method; and
    performing a polarization process on the piezoelectric film while the piezoelectric film is flat adhered to the even surface of the conductive substrate.

2. The method of claim 1, wherein the piezoelectric film comprises a PVDF homopolymer.

3. The method of claim 1, wherein the conductive substrate is a metal plate, a metal film, a carbon plate, or a metal coil.

4. The method of claim 1, wherein the conductive substrate comprises:
    a base, wherein the base comprises a plastic film, a transparent glass, or a plastic plate; and
    a conductive layer disposed on the base, wherein a surface of the conductive layer is the even surface of the conductive substrate, and the conductive layer comprises a metal layer, a conductive oxide layer, or a carbon nanopowder paste layer.

5. A method for polarizing a piezoelectric film, comprising:
    forming a piezoelectric film on a substrate by using a coating method;
    performing a stripping treatment to detach the piezoelectric film from the substrate;
    flat adhering the piezoelectric film to an even surface of a conductive substrate to make an adhesion surface of the piezoelectric film being in contact with the even surface of the conductive substrate, wherein flat adhering the piezoelectric film to the even surface of the conductive substrate comprises generating static electricity on the adhesion surface of the piezoelectric film, and generating the static electricity on the adhesion surface of the piezoelectric film comprises using a pressurized gas to blow the adhesion surface, and the adhesion surface of the piezoelectric film is adhered to the even surface of the conductive substrate by an electrostatic adsorption method; and
    performing a polarization process on the piezoelectric film by using a plasma source while the piezoelectric film is flat adhered to the even surface of the conductive substrate, wherein the plasma source is located over the piezoelectric film and is separated from the piezoelectric film.

6. The method of claim 5, wherein the piezoelectric film comprises a PVDF copolymer.

7. The method of claim 5, wherein the conductive substrate is a metal plate, a metal film, a carbon plate, or a metal coil.

8. The method of claim 5, wherein the conductive substrate comprises:
    a base, wherein the base comprises a plastic film, a transparent glass, or a plastic plate; and
    a conductive layer disposed on the base, wherein a surface of the conductive layer is the even surface of the conductive substrate, and the conductive layer comprises a metal layer, a conductive oxide layer, or a carbon nanopowder paste layer.

9. A method for polarizing a piezoelectric film, comprising:

forming a piezoelectric film on an even surface of a conductive substrate, wherein forming the piezoelectric film on the even surface of the conductive substrate comprises flat adhering the piezoelectric film on the even surface of the conductive substrate to make an adhesion surface of the piezoelectric film being in contact with the even surface of the conductive substrate, wherein flat adhering the piezoelectric film to the even surface of the conductive substrate comprises generating static electricity on the adhesion surface of the piezoelectric film, and generating the static electricity on the adhesion surface of the piezoelectric film comprises using a pressurized gas to blow the adhesion surface, and the adhesion surface of the piezoelectric film is adhered to the even surface of the conductive substrate by an electrostatic adsorption method; and performing a polarization process on the piezoelectric film while the piezoelectric film is flat adhered to the even surface of the conductive substrate.

10. The method of claim 9, wherein the piezoelectric film comprises a PVDF homopolymer or a PVDF copolymer.

11. The method of claim 9, wherein the conductive substrate is a metal plate, a metal film, a carbon plate, or a metal coil.

12. The method of claim 9, wherein the conductive substrate comprises:

a base, wherein the base comprises a plastic film, a transparent glass, or a plastic plate; and a conductive layer disposed on the base, wherein a surface of the conductive layer is the even surface of the conductive substrate, and the conductive layer comprises a metal layer, a conductive oxide layer, or a carbon nanopowder paste layer.

* * * * *